United States Patent [19]
Patel

[11] Patent Number: 5,587,882
[45] Date of Patent: Dec. 24, 1996

[54] THERMAL INTERFACE FOR A HEAT SINK AND A PLURALITY OF INTEGRATED CIRCUITS MOUNTED ON A SUBSTRATE

[75] Inventor: Chandrakant Patel, Fremont, Calif.

[73] Assignee: Hewlett-Packard Company, Palo Alto, Calif.

[21] Appl. No.: 521,480

[22] Filed: Aug. 30, 1995

[51] Int. Cl.⁶ .................................................. H05K 7/20
[52] U.S. Cl. .......................... 361/705; 257/713; 361/719
[58] Field of Search ............................... 174/16.3, 52.4; 439/485, 487; 165/80.3, 185; 257/778, 712, 713, 723, 724, 706, 707, 703; 361/690, 704, 705, 706, 707–709, 717–719, 736, 752

[56] References Cited

U.S. PATENT DOCUMENTS

| | | | |
|---|---|---|---|
| 4,092,697 | 5/1978 | Spaight | 361/705 |
| 4,593,342 | 6/1986 | Lindsay | 361/386 |
| 4,612,601 | 9/1986 | Watari | 361/705 |
| 4,715,430 | 12/1987 | Arnold | 165/80.3 |
| 4,771,365 | 9/1988 | Cichocki | 361/705 |
| 4,897,764 | 1/1990 | Bruchmann | 361/387 |
| 5,172,213 | 12/1992 | Zimmerman | 257/796 |
| 5,276,586 | 1/1994 | Hatsuda | 361/705 |
| 5,396,403 | 3/1995 | Patel | 361/705 |
| 5,430,611 | 7/1995 | Patel et al. | 361/705 |
| 5,520,976 | 5/1996 | Giannetti | 428/36.3 |

OTHER PUBLICATIONS

Backside Cooling Of Flip Chip Devices In Multichip Modules; Robert Darveaux and Iwona Turlik; ICMCM Proceedings '92; pp. 230–241.

Backside Cooling Solution For High Power Flip Chip Multi-chip Modules; Chandrakant D. Patel; 44th IEEE ECTC Proceedings, May 1994; pp. 442–449.

Primary Examiner—Gerald P. Tolin
Attorney, Agent, or Firm—John L. Imperato

[57] ABSTRACT

A referencing scheme provides a thermal interface between a heat sink and chips within a MultiChip Module (MCM). The referencing scheme comprises a heat sink with a support ring that penetrates a trough formed within a substrate of the MCM. A thermal transfer medium positioned between the heat sink and the chips forms a thermal interface having a low thermal resistance. This cools the chips and ensures reliable operation of the MCM. The trough is filled with a curable adhesive, securing the heat sink to the substrate of the MCM.

11 Claims, 6 Drawing Sheets

THERMAL INTERFACE FOR A HEAT SINK AND A PLURALITY OF INTEGRATED CIRCUITS MOUNTED ON A SUBSTRATE

BACKGROUND AND SUMMARY OF THE INVENTION

The high performance and low cost of modern desktop computers may be attributed to high device densities and high clock rates that are achievable within integrated circuits (ICs). The ICs used in desktop computers require a large number of input/output (I/O) interconnections and are operated at high clock rates, requiring short conductor paths between neighboring ICs. Flip-chip multichip modules, also referred to as MCMs, provide the I/O interconnections and short conductor paths. In the MCM, multiple unpackaged ICs or chips are mounted with the device side of each chip facing a common substrate. The chips are attached to the substrate using solder bumps while conductor paths between chips are provided by the substrate. The backside of each chip provides a thermal interface to a heat sink, used to cool the chips.

The high device densities and high clock rates of the chips produce corresponding increases in power density and power consumption. For example, a single chip within a MCM may be only 300 square millimeters in area but may dissipate as many as 60 Watts. As the performance trend in desktop computers is to drive integrated circuits toward even higher device densities and higher clock rates, the power density and power consumption of chips are also expected to increase. Thus, low thermal resistance at the thermal interface between the backside of the chips and the heat sink is essential to cool the chips and insure reliable operation of MCMs. Unfortunately, variations in substrate flatness, dimensional tolerance stack-up and mismatched thermal expansion coefficients of the chips, substrate and the heat sink have made it difficult to cool the chips using simple and cost-effective techniques.

A prior art chip cooling technique is described by Darveaux and Turlik, "Backside Cooling of Flip Chip Devices in Multichip Modules", ICMCM Proceedings, 1992, pp. 230–241. This technique is used in a Thermal Conduction Module (TCM) and incorporates a water-cooled heat sink with spring-loaded copper pistons that contact the backside of each chip within the TCM. The pistons provide mechanical compliance to accommodate dimensional tolerance stack-up and mismatches in thermal coefficients expansion between the heat sink, chips and substrate. Although this TCM may be feasible for cooling chips in mainframe computers, this approach is too expensive to be incorporated into low-cost, desktop computers.

Another prior art chip cooling technique is taught by Patel et al in U.S. Pat. No. 5,430,611 which issued Jul. 4, 1995. This technique uses a heat sink encapsulating a flip-chip multichip module (MCM). The backsides of the chips within the MCM are biased against the heat sink by a spring mechanism located on the side of a substrate opposite the side upon which the chips are mounted. Although this technique effectively cools the chips, the presence of the spring mechanism makes it difficult to bring electrical interconnections through the backside of the substrate and into the MCM using common electrical connectors, such as Pin Grid Arrays (PGAs).

In accordance with the illustrated preferred embodiment of the present invention a positional referencing scheme provides a low-cost thermal interface that has low thermal resistance between chips within a flip-chip multichip module (MCM) and a heat sink. The referencing scheme comprises a heat sink having a support ring that fits into a trough formed within a substrate of the MCM. The depth at which the support ring enters the trough references the position of the heat sink to the backside of the chips, cooling the chips and insuring reliable operation of the MCM. The trough is filled with a curable adhesive and when the adhesive cures, the heat sink is anchored to the substrate.

DETAILED DESCRIPTION OF THE PREFERRED EMBODIMENT

Figure 1:
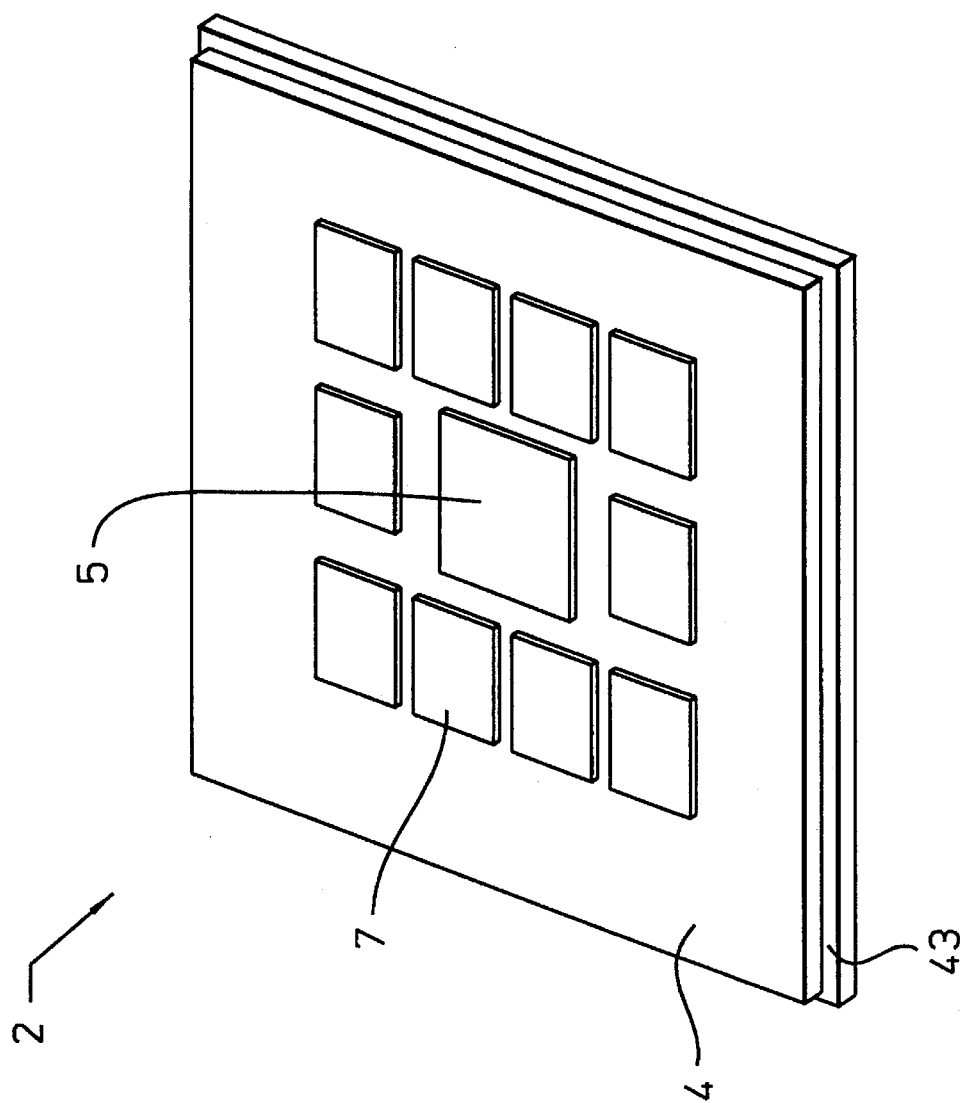
FIG. 1 shows a perspective view of a flip-chip multichip module (MCM) that is constructed in accordance with the preferred embodiment of the present invention.

FIG. 1 shows a perspective view of a flip-chip multichip module (MCM) 2 that is constructed in accordance with the preferred embodiment of the present invention. One VLSI (very large scale integration) chip 5 and ten RAM chips 7 are shown. Multiple chips 5 and 7 are mounted on a substrate 4 that is constructed from Mullite, Alumina or other suitable material. A trough 43 is formed in the substrate 4. Often, substrates are fabricated using multiple planar layers, each layer having conductors to provide the inter-chip routing. The unpackaged ICs or chips, 5 and 7, are mounted on the substrate 4 using solder bumps (not shown), with the device side of the chips, 5 and 7, facing the substrate 4. Solder bumps provide electrical connections and physical attachment between the chips, 5 and 7, and the substrate 4. The chips are close to each other to establish short conductor paths which enable the chips to operate at high clock rates. A typical MCM 2 used in a desktop computer application may have one or more VLSI chips 5 which may each dissipate more than 60 Watts, and a panoply of other chips such as cache RAM chips 7 which may each dissipate more than 4 Watts. In this MCM 2, the VLSI chip 5 and the ten cache RAM chips 7 dissipate a total of more than 100 Watts.

Figure 2:
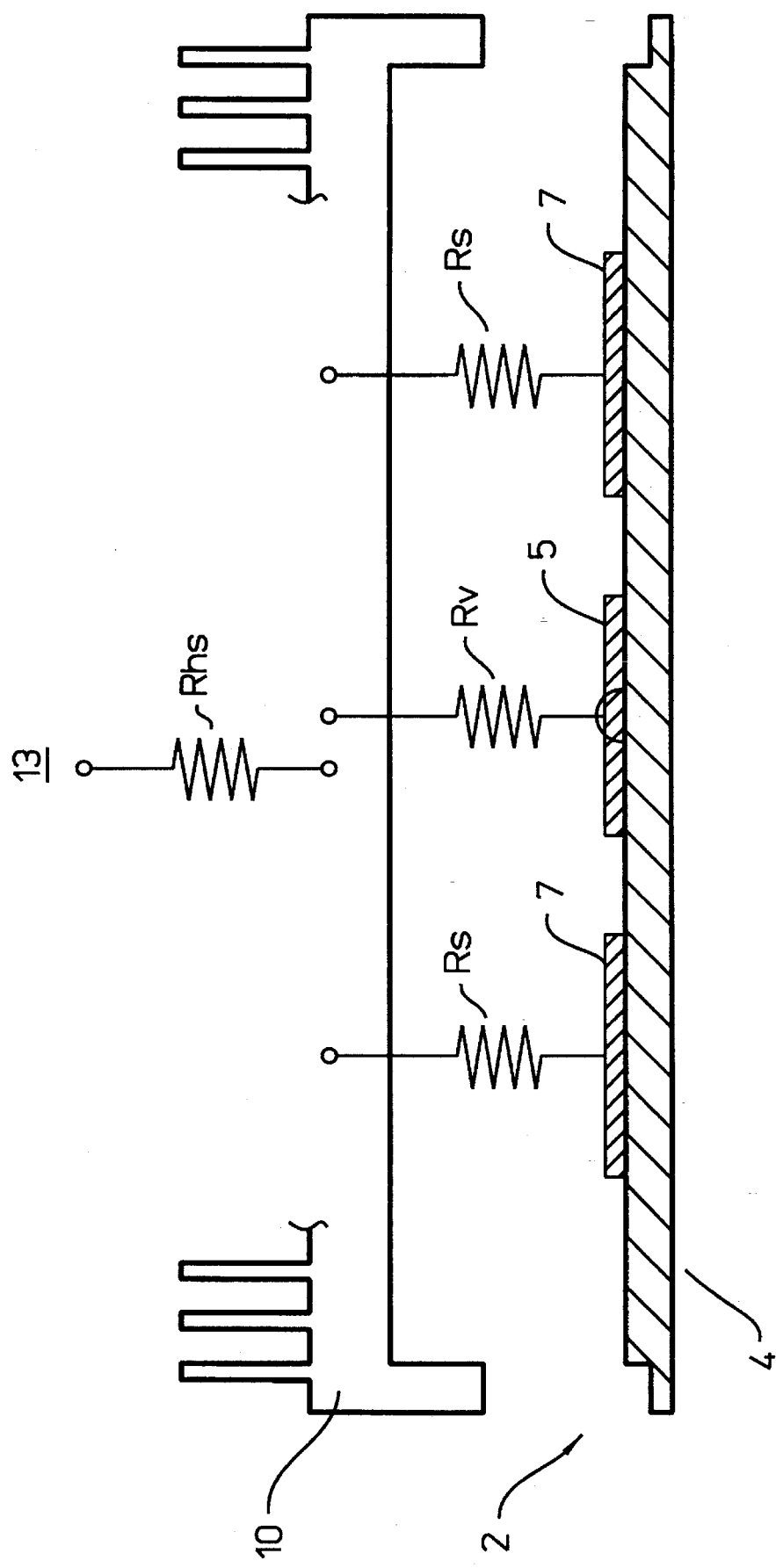
FIG. 2 shows a schematic representation of the thermal resistances between chips of a MCM and a heat sink that is constructed in accordance with the preferred embodiment of the present invention.

FIG. 2 shows a schematic representation of thermal resistances between the backside of each chip, 5 and 7, of a MCM 2 and a heat sink 10 (shown schematically) that is constructed in accordance with the preferred embodiment of the present invention. One VLSI chip 5 and two cache RAM chips 7 are shown mounted on a substrate 4. $R_v$ is a schematic representation of the thermal resistance between the backside of the VLSI chip 5 and a heat sink 10 and $R_s$ represents the thermal resistance between the backside of each cache RAM chip 7 and the heat sink 10. Thermal resistance $R_{hs}$ represents the thermal resistance between the heat sink 10 and ambient air 13. In order for the MCM 2 to operate reliably, the junction temperature of the devices within the VLSI chip 5 and cache RAM chips 7 are maintained below 85° C. when the heat sink 10 is exposed to ambient air 13 having a temperature of 40° C.

As an example, thermal resistance $R_{hs}$ indicates the cooling capability of the heat sink 10 and is equal to 0.35° C./W. The total power dissipation of the chips, 5 and 7, is 100 Watts. When the ambient air 13 is at 40° C., the heat sink temperature is approximately 75° C., which is 40° C. plus the product of $R_{hs}$ (0.35 ° C./W) and the total power dissipated by the MCM 2 (100 W). The temperature of the heat sink 10 then determines the thermal resistance values $R_v$ and $R_s$ needed to maintain a junction temperature less than 85° C. Since the VLSI chip 5 dissipates 60 Watts, $R_v$ may be calculated as (85° C.–75° C.)/60 W which equals approximately 0.17° C./W. Similarly, $R_s$ may be calculated as (85° C.–75 ° C.)/4 W which equals about 2.5° C./W. In summary: the MCM 2 in this example dissipates 100 Watts, thermal resistance $R_{hs}$ equals 0.35° C./W, $R_v$ equals 0.17° C./W and $R_s$ equals 2.5° C./W.

Figure 3:
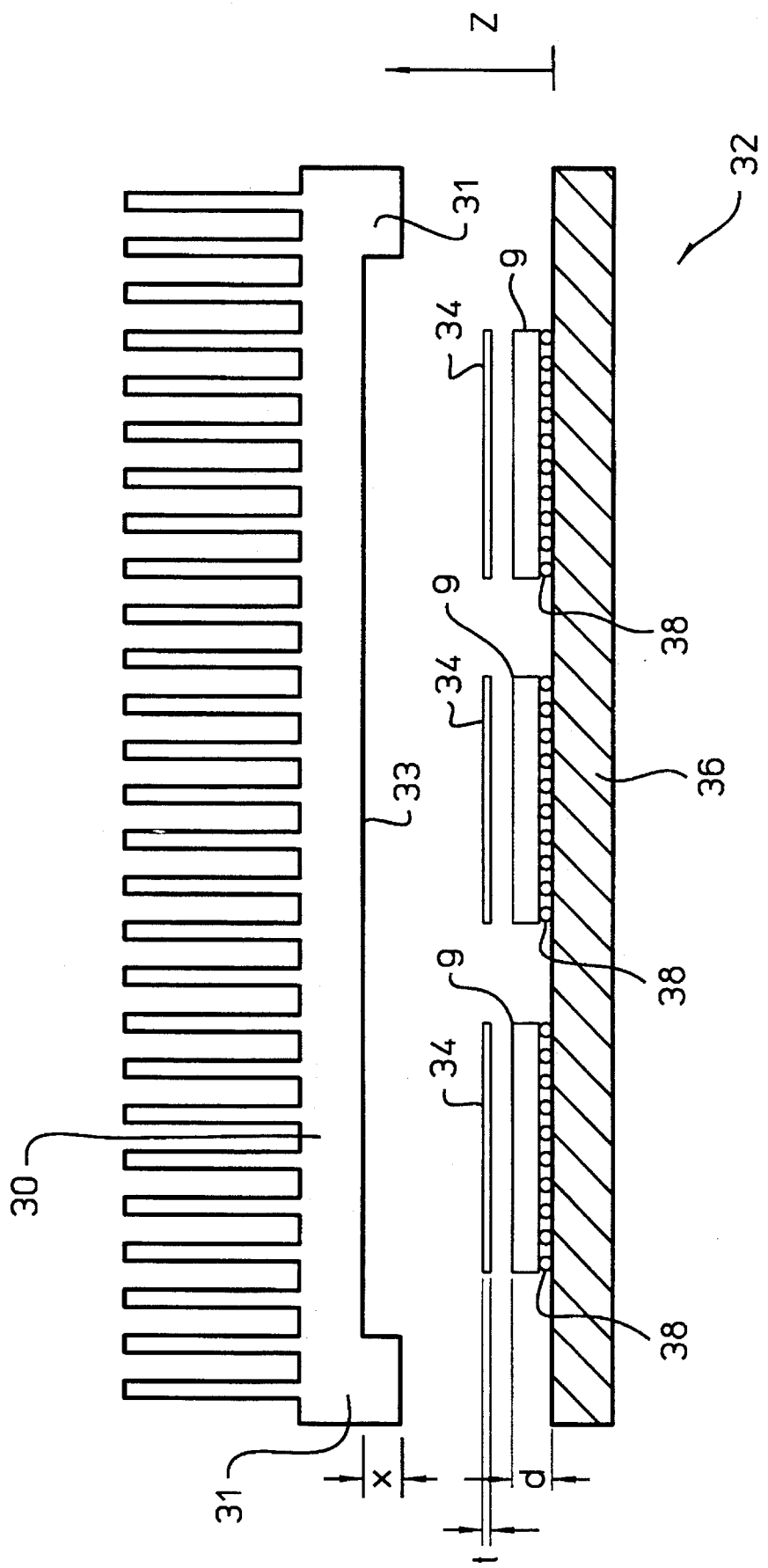
FIG. 3 shows a cross-sectional view of a prior art referencing technique for a thermal interface between chips of a MCM and a heat sink.

FIG. 3 shows a prior art referencing technique for a thermal interface between chips 9 of a MCM 32 and a heat sink 30. The heat sink 30 and thermal transfer media 34 are shown separated from the substrate 36 and chips 9 for the purpose of illustrating dimensional tolerance stack-up. The MCM 32 normally has the heat sink 30 attached to the substrate 36 and the thermal transfer media 34 is sandwiched between the contact surface 33 of the heat sink 30 and the chips 9, forming the thermal interface. A gap thickness t is defined by a gap formed between the contact surface 33 and the chips 9. Several factors make it difficult to control the gap thickness t of the thermal transfer media 34. The thickness of the chips cannot be precisely controlled due to limitations in integrated circuit manufacturing processes and the substrate 36 and heat sink 30 each have some inherent amount of unflatness. Due to manufacturing process limitations there are also variations in the size of solder bumps 38 which affect the height of the chips 9 on the substrate 36 when the chips 9 are attached. There is also a dimensional tolerance in the length x of the lip 31 of the heat sink 30. All of these factors accumulate to form a dimensional tolerance stack-up in the z-direction, indicated by the directional arrow z. The tolerance stack-up in the z-direction makes it difficult to precisely establish distance d, shown as the distance between the backside of the chips 9 and the surface of substrate 36.

The prior art referencing technique positions the heat sink 30 relative to the surface of the substrate 36. Thus, when the lip 31 contacts the substrate 36, since it is difficult to establish the distance d, it is in turn, difficult to control the gap thickness t of the gap between the chips 9 and the contact surface 33 of the heat sink 30. This gap is filled with thermal transfer media 34 and its gap thickness t has a large impact on the thermal resistance of the thermal interface. In order to accommodate the dimensional tolerance stack-up in thez- direction, the length x of lip 31 needs to be long enough for the lip 31 to contact the substrate 36 without having the contact surface 33 of the heat sink 30 touch the backside of the chips 9. However, if length x were made long enough to accommodate a worst case dimensional tolerance stack-up, for a substrate 36 of size 75 mm by 75 mm, the gap thickness t of the gap causes the thermal transfer media 34 to be as thick as 0.3 mm. Presently available thermal transfer media 34, such as thermally conductive epoxy or thermal paste have thermal conductivities in the range of 0.5 to 3.0 W/m-° C. Thermal resistance $R_v$ may be approximated by the thickness t of the thermal transfer media 34 (0.3 mm) divided by the thermal conductivity of the thermal transfer media 34 (3.0 W/m-° C.) and the area of the VLSI chip (300 square millimeters). This yields a thermal resistance $R_v$ equal to approximately 0.33° C./W, which exceeds the desired thermal resistance value of 0.17° C./W. As a result, this prior art referencing technique causes the junction temperature of the chips 9 to exceed the desired value of 85° C., having a negative impact on the reliability of the MCM 32.

Figure 4:
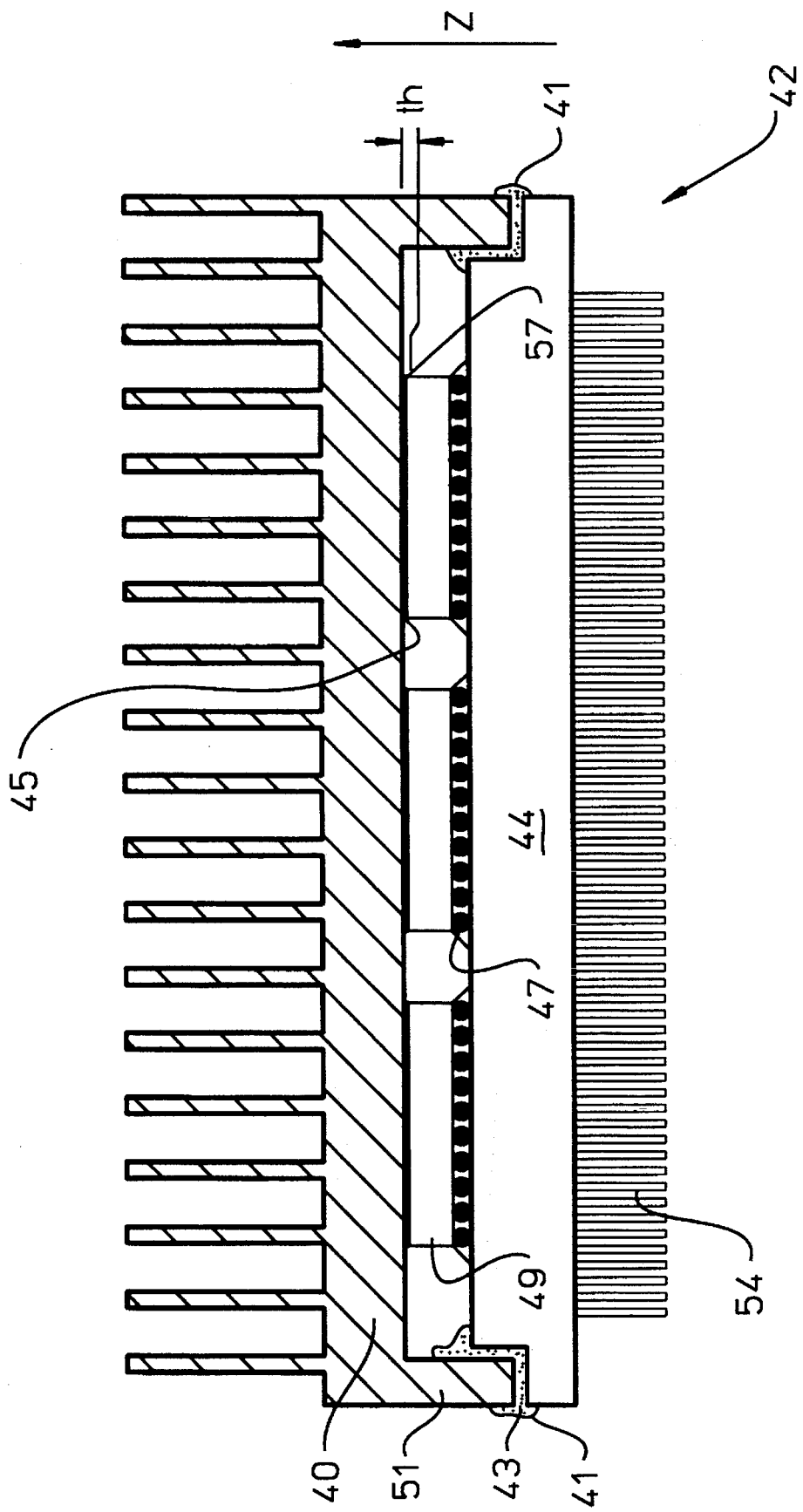
FIG. 4 shows a cross-sectional view of a referencing scheme for a thermal interface between chips of a MCM and a heat sink that is constructed in accordance with the preferred embodiment of the present invention.

FIG. 4 shows a referencing scheme for a thermal interface between chips 49 of a MCM 42 and a heat sink 40 that is constructed in accordance with the preferred embodiment of the present invention. The heat sink 40 conducts heat from the thermal interface to ambient air. A non-through peripheral trough 43 formed in substrate 44 enables the position, in the z-direction, of the heat sink 40 to be referenced to the backside of chips 49 in the flip-chip multichip module (MCM) 42. Although there may be a dimensional tolerance stack-up in the z-direction due to variations in thickness of the chips 49, unflatness of the substrate 44 and heat sink 40, and variations in the size of solder bumps 47, the thickness th of a gap 57 formed between the backsides of chips 49 and the heat sink 40 is precisely controlled. The gap 57 is filled by the thermal transfer media 45. The gap 57 is sufficiently thin to provide low enough thermal resistance between the heat sink 40 and chips 49 to keep the junction temperature of devices within the chips cool enough to ensure reliable operation of the MCM 42.

The thickness of the deposited thermal transfer medium 45 is determined by the product of the desired thermal resistance $R_v$, the thermal conductivity of the thermal transfer media 45 and the area of the chip 49. In this example, the desired thermal resistance Rv is less than 0.17° C./W, the thermal conductivity of the thermal transfer medium 45 is 2.5 W/m-° C. and the area of the chip is 300 square millimeters. The thickness th of the transfer media 45 is equal to 0.0025 W/mm-° C. times 0.17° C./W times 300 mm² which equals 0.13 mm. Thermal transfer medium 45 having thickness th less than 0.13 mm, enables the thermal resistance Rv to be less than 0.17° C./W, thus insuring that the junction temperature is less than 85° C.

In one embodiment of the present invention, the thermal transfer media 45 is a material that attaches the chips 49 to the heat sink 40. Examples of such materials include solder and thermally conductive epoxy. Thermally conductive epoxy that is deposited on the backside of the chips 49 as the thermal transfer medium 45 attaches the heat sink 40 to the chips 49. Solder provides a much lower thermal resistance than conductive epoxy, but the use of solder entails metallizing the backside of the chips 49. When solder or conductive epoxy is used, the thermal coefficient of expansion (TCE) of the heat sink 40 should closely match the TCE of the substrate 44. Matched TCEs reduce mechanical stresses on the chips 49 and solder bumps 47 by reducing differential dimensional changes of the heat sink 40 and substrate 44 that are caused by temperature changes. An aluminum-ceramic composite, such as Aluminum Silicon Carbide, approximately 70 percent aluminum by volume, provides excellent thermal conductivity and has a TCE which matches that of Alumina, a common substrate material. Aluminum Silicon Carbide is available from ALCOA Company and is easily shaped to form the heat sink 40. Because the TCE of the substrate 44 and the TCE of the heat sink 40 are matched, the adhesive 41 used to fill the trough 43 may be rigid, such as epoxy or resin.

In an alternative embodiment, the thermal transfer media 45 is a material that permits relative movement between the heat sink 40 and the chips 49, such as paste or thermal compound. A thermally conductive paste or a thermal compound deposited on the backside of the chips 49 acts as a thermal transfer medium 45 but does not attach the chips 49 to the heat sink 40. In this alternative embodiment the TCE of the heat sink 40 does not need to match the TCE of the substrate 44 because the thermal compound reduces mechanical stresses on the chips 49 and solder bumps 47 by allowing relative movement between the chips 49 and the heat sink 40. Relative movement results from differential dimensional changes of the heat sink 40 and substrate 44 resulting from temperature changes caused by the unmatched TCEs. The unmatched TCEs enable the heat sink to be formed from a variety of common materials such as aluminum, copper or other good thermal conductors. In this alternative embodiment, the curable adhesive 41 used to attach the substrate 44 to the support ring 51 is flexible, comprising an elastomer or a soft resin. An example of a curable elastomer is Sylgard, which is manufactured by Dow Corning Corporation.

Figure 5:
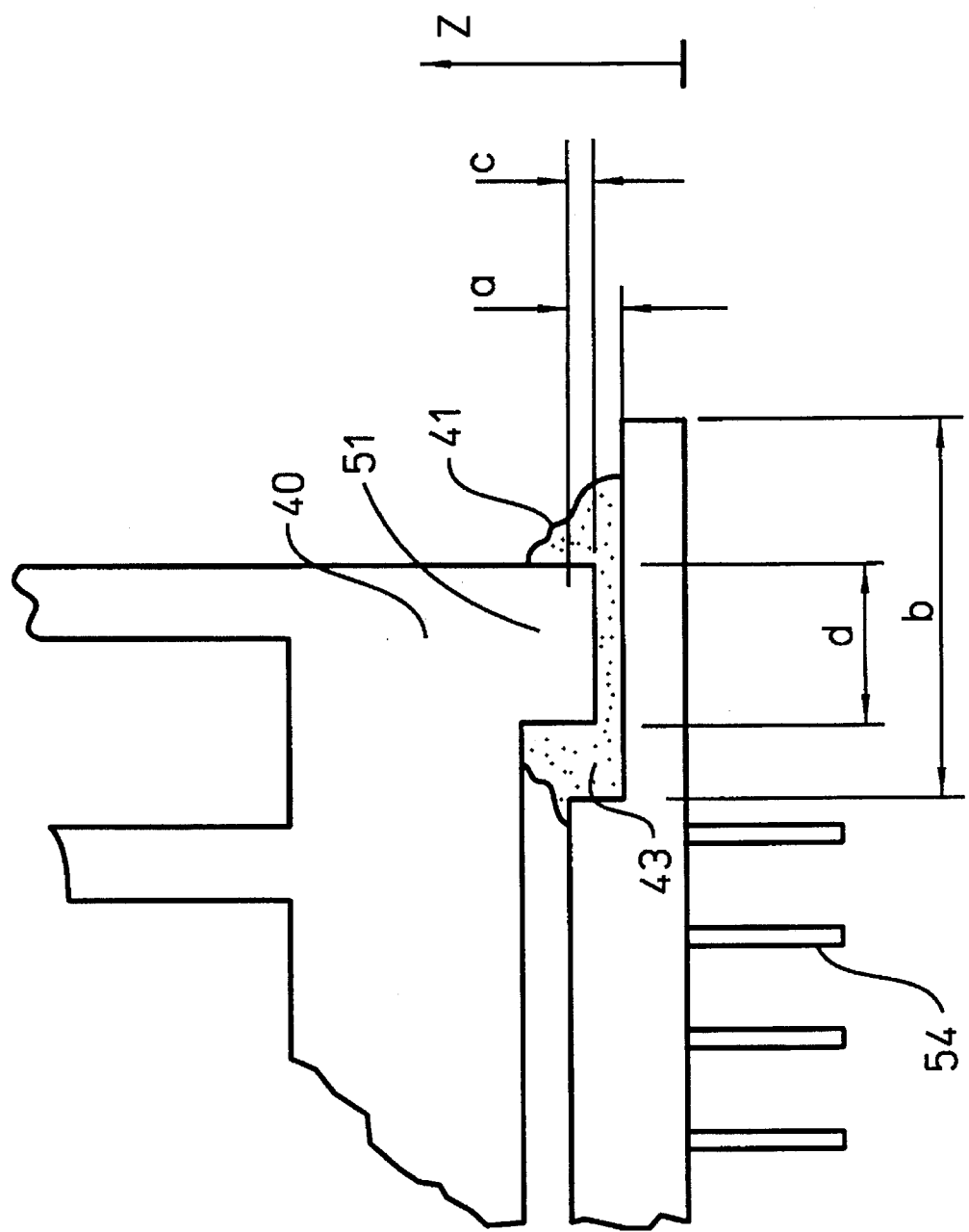
FIG. 5 shows a detailed view of a trough that is constructed in accordance with the preferred embodiment of the present invention.

FIG. 5 shows a detailed view of a trough 43 that is constructed in accordance with the preferred embodiment of the present invention. The trough depth a is deeper than the total dimensional tolerance stack-up in the z-direction of the components of the MCM. The penetration depth c, which the support ring 51 penetrates the trough 43, assures that the heat sink 40 is positioned in contact with the thermal transfer medium 45. This references the position of the heat sink 40 to the backsides of the chips 49. The trough width b accommodates the differential change in dimensions of the heat sink 40 and substrate 44 due to changes in temperature. The trough width b is larger than the rim width d of the support ring 51 plus the product of the length of the heat sink 40, the temperature range, and the difference in TCEs between the substrate 44 and heat sink 40. A curable adhesive 41 fills the trough 43 and when the adhesive 41 cures, the heat sink 40 is anchored to the substrate 44. The trough 43 provides adequate surface area between the heat sink 40 and the substrate 44 for attachment by the adhesive 41. The trough 43 also provides support for the heat sink 40, as force is often applied to it when the MCM 42 is connected to other circuits via a PGA 54 or other electrical connector.

Figure 6:
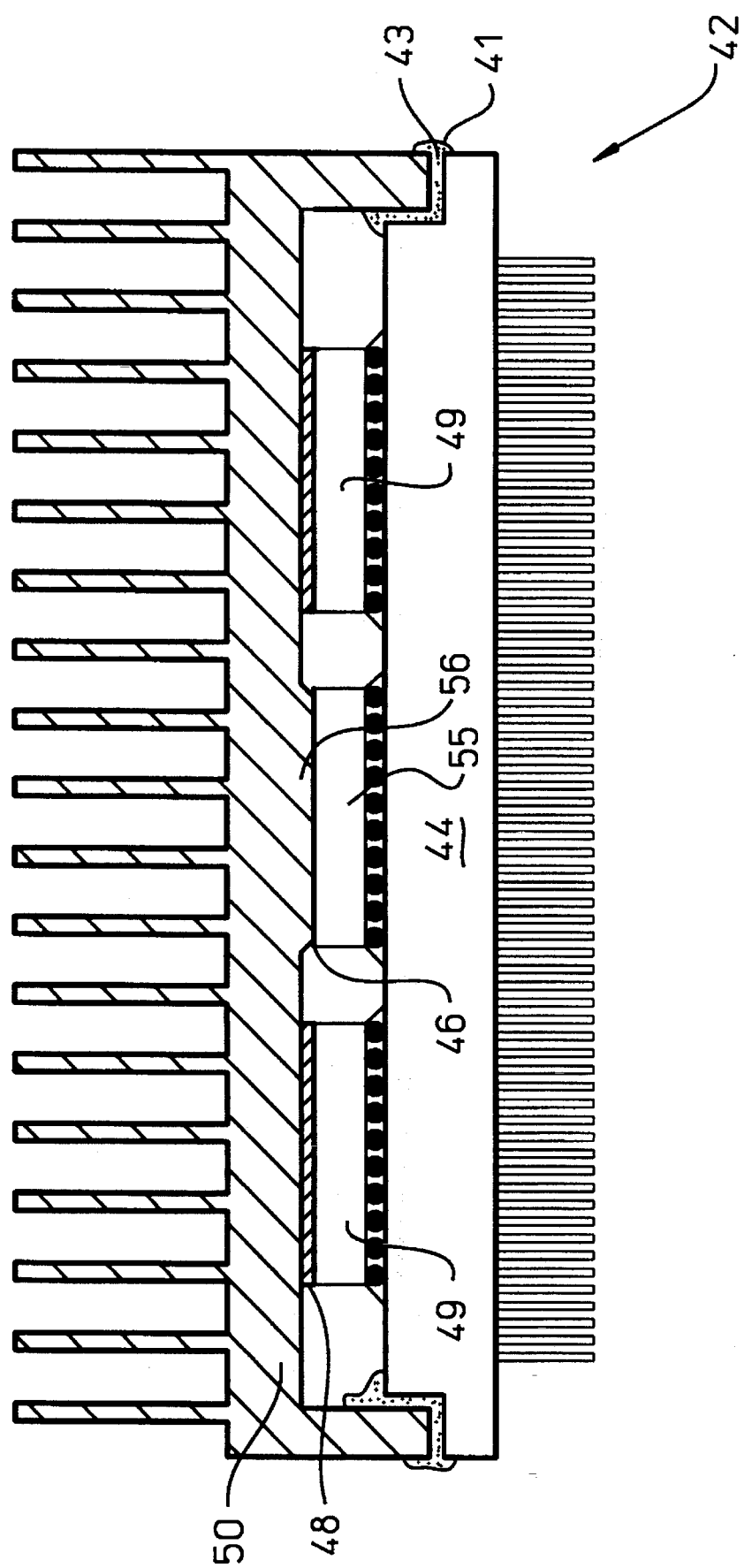
FIG. 6 shows a cross-sectional view of a selective referencing scheme for a thermal interface between chips of a MCM and a heat sink that is constructed in accordance with an alternative preferred embodiment of the present invention.

FIG. 6 shows a cross-sectional view of a selective referencing scheme for a thermal interface between chips of a MCM 42 and a heat sink 50 that is constructed in accordance with an alternative preferred embodiment of the present invention. Often, a particular chip such as a VLSI 55, mounted on the substrate 44 of the MCM 42 has higher power dissipation or higher power density than other chips 49 in the MCM 42. It is desirable to achieve the lowest thermal resistance between the VLSI chip 55 and the heat sink 50 relative to the thermal resistance between the other chips 49 and the heat sink 50. Selective referencing ensures that the VLSI chip 55 will have the lowest thermal resistance at the heat sink-to-chip interface. To selectively reference the VLSI chip 55, a pedestal 56 is formed in the heat sink 50 in the region corresponding to the location of the VLSI chip 55, enabling a thermal transfer medium 46 between the VLSI 55 and the heat sink 50 to be thinner than the thicker thermal transfer medium 48 between the other chips 49 and the heat sink 50.

A referencing scheme forms a thermal interface, providing a low thermal resistance between chips and a heat sink. The preferred embodiments for chips in a flip-chip multichip module (MCM) is applicable to single chip modules such as those containing a high speed microprocessor. The referencing scheme is also applicable to other heat generating devices besides integrated circuits, such as resistors, power transistors or other discrete devices. In each application of the present invention, the position of the heat sink is referenced to the heat generating device, thereby controlling the thickness of the thermal transfer media and providing low thermal resistance at the thermal interface between the heat generating devices and the heat sink.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims.

I claim:

1. A module assembly, comprising:
   a planar substrate having a top surface, the top surface having a non-through peripheral trough;
   at least one heat generating device mounted on the top surface of the substrate;
   a heat sink having a support ring penetrating the trough;
   a thermal transfer medium having a predetermined thickness, positioned between the at least one heat generating device and the heat sink, operative to conduct heat from the at least one heat generating device to the heat sink; and
   a curable adhesive within the trough, securing the support ring to the substrate wherein the depth of penetration of the support ring into the trough positions the thermal transfer medium in contact with the heat sink and the at least one heat generating device.

2. The module assembly of claim 1 wherein the at leas one heat generating device comprises at least one integrated circuit mounted on the substrate using solder bumps.

3. The module assembly of claim 1 wherein the at least one heat generating device comprises at least one resistor.

4. The module assembly of claim 1 wherein the thermal transfer medium comprises thermally conductive epoxy.

5. The module assembly of claim 4 wherein the heat sink is fabricated from Aluminum Silicon Carbide.

6. The module assembly of claim 2 wherein the thermal transfer medium comprises thermal compound.

7. The module assembly of claim 6 wherein the curable adhesive comprises an elastomer.

8. The module assembly of claim 2 further comprising a pin grid array electrical connector attached to the substrate.

9. A referencing scheme cooling integrated circuits mounted on a top surface of a planar substrate, comprising:
   a heat sink having a support ring;
   a thermal transfer medium having a predetermined thickness, positioned between the heat sink and the integrated circuits;
   a non-through peripheral trough formed on the top surface of the substrate receiving the support ring, the support ring entering the trough to position the heat sink in contact with the thermal transfer medium; and
   an adhesive securing the position of the support ring in the trough.

10. The referencing scheme of claim 9 wherein the thermal transfer medium comprises thermally conductive epoxy.

11. The referencing scheme of claim 9 wherein the thermal transfer medium comprises thermal compound.

* * * * *